(12) United States Patent
Tomari et al.

(10) Patent No.: US 8,034,514 B2
(45) Date of Patent: Oct. 11, 2011

(54) PHOTOSENSITIVE RESIN COMPOSITION FOR VOLUME PHASE HOLOGRAM RECORDING AND OPTICAL INFORMATION RECORDING MEDIUM USING THE SAME

(75) Inventors: Kouhei Tomari, Fukuoka (JP); Yasuji Shichijo, Fukuoka (JP); Masanao Kawabe, Fukuoka (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 833 days.

(21) Appl. No.: 11/885,787

(22) PCT Filed: Mar. 1, 2006

(86) PCT No.: PCT/JP2006/303832
§ 371 (c)(1),
(2), (4) Date: Apr. 30, 2008

(87) PCT Pub. No.: WO2006/095610
PCT Pub. Date: Sep. 14, 2006

(65) Prior Publication Data
US 2009/0053615 A1    Feb. 26, 2009

(30) Foreign Application Priority Data
Mar. 8, 2005    (JP) ................................ 2005-063724

(51) Int. Cl.
*G03H 1/02* (2006.01)
(52) U.S. Cl. .................. 430/1; 430/2; 430/280.1; 359/3
(58) Field of Classification Search .................. None
See application file for complete search history.

(56) References Cited

U.S. PATENT DOCUMENTS

| | | | |
|---|---|---|---|
| 3,993,485 A | 11/1976 | Chandross et al. | |
| 5,759,721 A | 6/1998 | Dhal et al. | |
| 5,830,621 A * | 11/1998 | Suzuki et al. | 430/287.1 |
| 5,874,187 A * | 2/1999 | Colvin et al. | 430/2 |
| 6,124,076 A | 9/2000 | Dhar et al. | |
| 6,784,300 B2 | 8/2004 | Cetin et al. | |
| 7,402,645 B2 * | 7/2008 | Kawabe | 526/336 |
| 7,582,231 B2 * | 9/2009 | Foulger et al. | 252/588 |
| 7,595,362 B2 * | 9/2009 | Kawabe et al. | 525/132 |
| 2005/0058910 A1 * | 3/2005 | Takizawa et al. | 430/1 |
| 2006/0177666 A1 * | 8/2006 | Kawabe | 428/411.1 |
| 2009/0130568 A1 * | 5/2009 | Tomari et al. | 430/2 |
| 2010/0203429 A1 * | 8/2010 | Tomari et al. | 430/2 |

FOREIGN PATENT DOCUMENTS

| | | |
|---|---|---|
| JP | 05-094014 | 4/1993 |
| JP | 09-106242 | 4/1997 |
| JP | 2000-086914 | 3/2000 |
| JP | 2004-123873 | 4/2004 |
| WO | WO-03/081344 | 10/2003 |

OTHER PUBLICATIONS

Antonettit et al. "Self-diffusion of polystyrene chains in networks", Macromol. 18(6) pp. 1162-1166 (1985).*
Sasa et al. "A novel UV-sensitive photopolymerization system with microgel matrix", Poly. Adv. Technol. vol. 5 pp. 98-104 (1994).*
Sasa et al. "Photopolymerization system with microgel matrix: application to visible laser recording materials and effects . . . ", Chem. Mater., vol. 5(10) pp. 1434-1438 (1993).*
Sasa et al., "Surface activated photopolymer microgels" Adv. Mater., vol. 6(5) pp. 417-421 (May 1994).*
International Preliminary Report on Patentability dated Aug. 12, 2008, issued on PCT/JP2006/303832 (2 pages).
Written Opinion of the International Searching Authority, issued on PCT/JP2006/303832 (4 pages).
Notification Concerning Transmittal of International Preliminary Report on Patentability, Sep. 2007.

* cited by examiner

*Primary Examiner* — Martin Angebranndt
(74) *Attorney, Agent, or Firm* — Edwards Angell Palmer & Dodge LLP

(57) ABSTRACT

The present invention relates to a volume phase hologram recording material excellent in transparency, sensitivity, low curing shrinkage, and transparency, a volume phase hologram recording medium, and a volume phase hologram. A photosensitive resin composition for volume phase hologram recording contains a low-molecular-weight solvent-soluble aromatic copolymer (A) having a structural unit of a divinyl aromatic compound and a structural unit of a monovinyl aromatic compound, a photoradical polymerizable compound (B) which is copolymerizable with the soluble aromatic copolymer (A), and a photopolymerization initiator (C) as essential components. The photosensitive resin composition further contains, one kind or more of a polymer binder (D) and a plasticizer (E), and the soluble aromatic copolymer (A) is incorporated in an amount of 5 to 60% by weight.

10 Claims, No Drawings

US 8,034,514 B2

PHOTOSENSITIVE RESIN COMPOSITION FOR VOLUME PHASE HOLOGRAM RECORDING AND OPTICAL INFORMATION RECORDING MEDIUM USING THE SAME

TECHNICAL FIELD

The present invention relates to a photosensitive resin composition for volume phase hologram recording, which is suitable as a volume phase hologram material capable of being formed into a thick film, that can be promptly optically cured by an active energy ray (such as a visible light laser, an ultraviolet ray, or an electron ray), is excellent in hologram characteristics such as diffraction efficiency and resolving power, and is excellent in transparency, thermostability, and so on. The present invention also relates to an optical information recording medium using the photosensitive resin composition.

BACKGROUND ART

Conventionally, holograms have mainly been used in the fields of stereoscopic image display and security. As materials for the holograms, wet-type materials that require development such as silver salt photosensitive materials and dichromate gelatin, have been mainly used in old times. Recently, however, a dry-type photopolymerizable hologram recording material excellent in environment resistance and light resistance after recording, which does not require any development process, has become the mainstream. A recording mechanism of the photopolymerizable hologram recording material, which is different from that of the silver salt photosensitive material, the dichromate gelatin, and the like, is generally considered as follows. That is, when an interference pattern composed of the interference of light excellent in coherence is irradiated onto a recording material, substances having different polymerization abilities respectively diffuse and migrate to a bright part of the light (higher light intensity area) and a dark part of the light (lower light intensity area) to form a refractive-index modulated structure as the photopolymerization proceeds, thereby recording a hologram. There are three types of polymerization forms of photopolymerizable hologram recording materials: (1) a radical polymerization type; (2) a cationic polymerization type; and (3) a radical/cationic polymerization combination type. The photoradical polymerization-type materials are commonly used. However, there is a disadvantage in that even though the sensibility is high, shrinkage attributable to the polymerization form is as high as several percents. Currently, among the photopolymerizable hologram recording materials, OMNIDEX manufactured by DuPont is the only photosensitive resin composition available in the market.

In recent years, for the realization of a ubiquitous information society, studies aiming at using photopolymerizable hologram recording materials for holographic data storages have become active again all over the world, and various photopolymerizable hologram recording materials have been proposed. Drastic progressions in technologies of laser optical sources, spatial light modulators, and so on while promoting national projects Holographic Data Storage System (HDSS, 1955-1999) and Photorefractive Information Storage Materials (PRISM, 1994-1998) that have started in the United States from the mid 1990s are contributable to such movements. A conventional technology for recording data on an optical disk such as a CD or a DVD is carried out such that laser beams are converged on a recording material through a lens to record data thereon bit by bit. The data-recording capacity defined by a size of a beam-converged spot has already come to its theoretical limit, so a new technology has been expected for a further increase in recording capacity. One of the technologies that has been attracting attention in recent years is holography.

The holographic data storage can perform volume recording instead of in-phase recording such as in CDs and DVDs, and data to be handled is page data, so the holographic data storage can record a large amount of data in comparable to the conventional CDs and DVDs. Currently, in each research institution, material development and recording technology development are actively performed toward putting the Write Once Read Many (WORM) type hologram optical disc capable of performing 1 terabyte (TB) recording to practical use. According to a basic design concept of a material for the holographic data storage, the material to be used is the same as the photopolymerizable hologram recording material for use in stereoscopic image recording or security as mentioned above. However, for use in the photographic data storage, requirements for the material, particularly sensitivity to an optical source to be used and cure shrinkage, are extremely strict. Typical examples of the photosensitive resin composition for the holographic data storage include one available from DCE Aprilis, Inc. in the United States affiliated with Polaroid Corporation in the United States and one available from InPhase Technologies Inc. in the United States affiliated with Lucent Technologies.

First, for example, as described in Patent Documents 1 and 2, DCE Aprilis, Inc. in the United States discloses materials with controlled polymerization shrinkage prepared by using Cationic Ring-Opening Polymerization (CROP) monomers having oxirane and oxetane rings and obtained through pre-photoirradiation. However, although cationic polymerization shows a small degree of enzyme inhibition as in radical polymerization, the sensitivity thereof is slightly deteriorated in a long-wavelength region. In contrast, for example, as described in Patent Document 3, 4 or 5, InPhase Technologies Inc. in the United States discloses a material having an extremely small polymerization shrinkage of 1% or less, which is attained by using cyclohexane oxide in combination with an expanding agent (diphenylfuran carboxylate). Also in this case, however, cure shrinkage is prevented by whole-area exposure before or after recording using a cationic ring-opening polymerizable monomer. However, no proposal has been made to improve the sensitivity. For putting the holographic data storage to practical use, a further improvement in photosensitivity, a reduction in cure shrinkage, and an improvement in thermostability are expected.

Patent Document 1: U.S. Pat. No. 5,759,721
Patent Document 2: U.S. Pat. No. 6,784,300
Patent Document 3: U.S. Pat. No. 3,993,485
Patent Document 4: U.S. Pat. No. 6,124,076
Patent Document 5: JP 2000-086914 A
Patent Document 6: JP 5-94014 A
Patent Document 7: JP 9-106242 A
Patent Document 8: JP 2004-123873 A In Patent Documents 6 and 7, a hologram photosensitive resin composition containing as a blended mixture of radically polymerizable ethylene monomers, a photopolymerization initiator, and an epoxy resin is described. In this composition, the radically polymerizable ethylene monomers are preferentially polymerized from the bright portion of an interference pattern at the time of hologram exposure with laser. A hologram is formed by using the phenomenon in which the ethylene monomers migrate to the bright portion. Note that the epoxy resin is cured after that. Patent Document 8 describes a soluble aromatic copolymer aromatic copolymer having a structural unit of a divinyl aromatic compound and a structural unit of a monovinyl aromatic compound, but does not disclose the use of the hologram.

DISCLOSURE OF THE INVENTION

Problems to be Solved by the Invention

Up to now, a large number of material systems have been studied and disclosed as photosensitive resin compositions on which volume phase holograms can be recorded. However, there has been no photosensitive resin composition that can simultaneously satisfy both photosensitivity and cure shrinkage. When the volume phase hologram recording resin composition is used for a holographic data storage, the photosensitivity and the low cure shrinkage rate in particular are required to be of a higher level.

The present invention has been made in view of the aforementioned circumstances and intends to provide a resin composition for volume phase hologram recording, which has good diffraction efficiency, resolving power, transparency, thermostability, and so on, and particularly excellent in photosensitivity, all of which are required for a volume phase hologram, and also an optical information recording medium obtained by using the composition. It goes without saying that in addition to the holographic data storage, the hologram obtained by the present invention can be used in other applications such as a diffraction grating, an interference filter, a lens, and a head-up display, thereby exerting effectiveness.

Means for Solving the Problems

As a result of intensive studies for solving the above-mentioned problems, the inventors of the present invention have found that by mixing a soluble polyfunctional vinyl aromatic copolymer with a copolymerizable photoradical polymerizable compound in the composition, photosensitivity is further enhanced while preventing shrinkage after curing, thereby completing the present invention.

According to the present invention, there is provided a photosensitive resin composition for volume phase hologram recording, including: a soluble aromatic copolymer (A) having a structural unit of a divinyl aromatic compound and a structural unit of a monovinyl aromatic compound, and containing 10 mol % or more of a structural unit represented by the following general formula (a1):

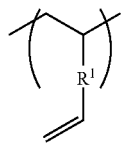

(a1)

where $R^1$ represents an aromatic hydrocarbon group having 6 to 30 carbon atoms; a photoradical polymerizable compound (B) which is copolymerizable with the soluble aromatic copolymer (A); a photopolymerization initiator (C); and a polymer binder (D) and/or a plasticizer (E), in which the soluble aromatic copolymer (A) is incorporated in an amount of 5 to 60% by weight.

Further, according to the present invention, there is provided an optical information recording medium for volume phase hologram recording, including a recording layer made of the photosensitive resin composition formed on a substrate or between two substrates. Further, according to the present invention, there is provided a volume phase hologram, which is obtained by recording an interference pattern formed of energy lines excellent in coherence on the optical information recording medium. Further, according to the present invention, there is provided a method of manufacturing a volume phase hologram, including the steps of exposing and recording an interference pattern formed of energy lines excellent in coherence on the recording medium.

The photosensitive resin composition of the present invention is a resin composition for volume phase hologram recording to be used for recording an interference pattern composed of an interference of light having an excellent coherence as a pattern with a different refractive index. The resin composition includes: a soluble aromatic copolymer (A), a photoradical polymerizable compound (B), and a photopolymerization initiator (C) as essential components. In addition, the resin composition includes as an essential component a polymer binder (D) or a plasticizer (E) or both in combination.

First, the soluble aromatic copolymer (A) will be described.

The soluble aromatic copolymer (A) can be obtained by copolymerizing a divinyl aromatic compound with a monovinyl aromatic compound and includes 10 mol % or more of a structural unit containing a reactive vinyl group on the side chain represented by the above formula (a1). The structural unit represented by the formula (a1) is derived from a divinyl aromatic compound as a monomer. Preferably, three or more structural units represented by the formula (a1) are included in one molecule on average. Further, the soluble aromatic copolymer (A) is a known compound as described in Patent Document 8 or the like, and can be suitably manufactured by a method described therein.

Examples of divinyl aromatic compounds include, but not limited to, m-divinylbenzene, p-divinylbenzene, 1,2-diisopropenylbenzene, 1,3-diisopropenylbenzene, 1,4-diisopropenylbenzene, 1,3-divinyl naphthalene, 1,8-divinyl naphthalene, 1,4-divinyl naphthalene, 1,5-divinyl naphthalene, 2,3-divinyl naphthalene, 2,7-divinyl naphthalene, 2,6-divinyl naphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributyl naphthalene, and 2,2'-divinyl-4-ethyl-4'-propylbiphenyl. Those may be used alone or two or more may be used in combination.

Specific examples of the divinyl aromatic compound preferably include divinylbenzene (both m- and p-isomers), divinylbiphenyl (including each isomer), and divinylnaphthalene (including each isomer), more preferably divinylbenzene (both m- and p-isomers) and divinylbiphenyl (including each isomer), particularly preferably divinylbenzene (both m- and p-isomers) in terms of costs and thermostability of the polymer.

Examples of the monovinyl aromatic compounds include styrene, vinyl naphthalene, vinyl biphenyl, and derivatives thereof. The derivatives include compounds in which aromatic rings are substituted with substituents such as an alkyl group, an alkoxy group, a halogen, and a phenyl group, as well as compounds in which the α- or β-position of a vinyl group is substituted with any of the above substituents. In addition, aromatic olefin such as indene and acenaphthylene, and derivatives thereof can be used as monovinyl aromatic compounds. Each of them may be used independently or two or more of them may be used in combination.

Examples of the styrene derivative include methyl styrene, ethyl styrene, propyl styrene, butyl styrene, pentyl styrene, hexyl styrene, cyclohexyl styrene, ethoxy styrene, propoxy styrene, butoxy styrene, pentoxy styrene, hexoxy styrene, cyclohexoxy styrene, and phenoxy styrene. Each of these substituents can substitute a vinyl group at the o, m, or p position with respect to the vinyl group, and when a side chain can be included therein, the substituents may be a straight- or branched-alkyl or alkoxy group.

Examples of indene or derivatives thereof include indene, an indene substituted with alkyl having 1 to 6 carbon atoms, and indene substituted with alkoxy having 1 to 6 carbon atoms. Examples of acenaphthylene or derivatives thereof include acenaphthylene, acenaphthylene substituted with alkyl having 1 to 6 carbon atoms, phenyl-substituted acenaphthylene, and acenaphthylene substituted with halogen such as chlorine and bromine.

The monovinyl aromatic compound is not limited thereto. Among these monovinyl aromatic compounds, a nuclear alkyl-substituted aromatic vinyl compound and an α-alkyl-substituted aromatic vinyl compound are preferable compounds in terms of a large amount of an indan structure formed in the skeleton of the copolymer when polymerized. Preferable examples thereof include, in terms of costs and the thermostability of the polymer obtained, ethyl vinyl benzene (both m- and p-isomers), ethyl vinyl biphenyl (including each isomer), and ethyl vinyl naphthalene (including each isomer).

The soluble aromatic copolymer (A) can be obtained by copolymerizing the divinyl aromatic compound with the monovinyl aromatic compound as described above. Alternatively, any of other monomers may be used if necessary. The other monomers include trivinyl aromatic compounds, diene compounds such as butadiene and isoprene, alkyl vinyl ether, isobutene, and diisobutylene. The other monomer is used in the range of less than 30 mol % of the total monomer. In addition, the divinyl aromatic compound is used in the range of 20 mol % or more, preferably in the range of 40 to 80 mol % of the total monomer. The monovinyl aromatic compound is used in the range of 10 mol % or more, preferably 20 to 60 mol % or more of the total monomer.

A preferable example of a polymerization method of manufacturing the soluble aromatic copolymer (A) includes a method described in Patent Document 8. For example, the method is as follows.

In an organic solvent, a monomer component containing 20 to 100 mol % of the divinyl aromatic compound (a) is subjected to a cationic polymerization at a temperature of 20 to 120° C. using a Lewis acid catalyst and an initiator represented by the following general formula (1):

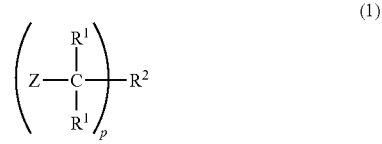

(1)

(where $R^1$ represents a hydrogen atom or a monovalent hydrocarbon group having 1 to 6 carbon atoms, $R^2$ represents a p-valent aromatic hydrocarbon group or an aliphatic hydrocarbon group, Z represents a halogen atom, or an alkoxyl group or an acyloxyl group having 1 to 6 carbon atoms, and p represents an integer of 1 to 6; if two or more $R^1$'s and Z's are present in a molecule, they may be identical to or different from each other).

The organic solvent is preferably one or more kinds of organic solvents having a dielectric constant of 2 to 15, and preferably includes a donor component selected from the group consisting of quaternary ammonium salt, ether compounds having 3 or more carbon atoms, a thioether compound having 3 or more carbon atoms, and sulfoxide compounds having 2 or more carbon atoms. Any organic solvent can be used without any particular limitation as far as it is a compound that does not inherently block the cationic polymerization. In addition, the organic solvents are preferably used as a polymerized solvent by using the organic solvents independently or in combination of two or more so that a dielectric constant ranges between 2 and 15. The organic solvents include: halogenated hydrocarbons such as chloromethyl, dichloromethane, n-propyl chloride, n-butyl chloride, chloromethane, trichloromethane, tetrachloromethane, chloroethane, dichloroethane, trichloroethane, tetra-chloroethane, chloroethylene, dichloroethylene, chlorobenzene, chlorobenzene, dichlorobenzene, and trichlorobenzene; aromatic hydrocarbons such as benzene, toluene, xylene, ethyl benzene, propyl benzene, and butylbenzene; linear aliphatic hydrocarbons such as ethane, propane, butane, pentane, hexane, heptane, octane, nonane, and decane; branched aliphatic hydrocarbons such as 2-methylpropane, 2-methylbutane, 2,3,3-trimethylpentane, and 2,2,5-trimethyl hexane; cyclic aliphatic hydrocarbons such as cyclohexane, methylcyclohexane, and ethylcyclohexane; and paraffin oil obtained by refining a petroleum fraction by hydrogenation. Of those, dichloroethane, toluene, xylene, pentane, hexane, heptane, octane, 2-methylpropane, 2-methylbutane, methylcyclohexane, and ethylcyclohexane are preferable. From the viewpoint of a balance of polymerization and solubility as well as availability, dichloroethane, toluene, xylene, n-hexane, cyclohexane, heptane, methylcyclohexane, and ethylcyclohexane are more preferable. The amount of the organic solvent to be used is generally determined so that the concentration of the polymer will be 1 to 50 wt %, preferably 5 to 35 wt %, in consideration of the viscosity of a polymer solution to be obtained and easiness in heat removal. A dielectric constant of less than 2 of an organic solvent decreases in polymerization activity. In contrast, a dielectric constant of more than 15 is unfavorable because it tends to cause gelation when polymerized. In addition, in the polymerization, it is preferable that with respect to 1 mole of the initiator represented by the general formula (1), 0.001 to 100 moles, preferably 0.3 to 50-fold moles of a Lewis acid catalyst and 0.001 to 10 moles of a donor component are used, and that the polymerization is carried out in an organic solvent in which the soluble aromatic copolymer is dissolved.

Specific examples of the Lewis acid catalyst used as a polymerization catalyst include: metal halide compounds such as boron bromide (III), boron chloride (III), aluminum bromide (III), aluminum fluoride (III), aluminum chloride (III), aluminum iodide (III), gallium bromide (III), gallium chloride (III), indium bromide (III), indium chloride (III), indium fluoride (III), indium iodide (III), thallium bromide (III), thallium fluoride (III), silicon bromide (IV), silicon chloride (IV), silicon fluoride (IV), silicon iodide (IV), germanium bromide (IV), germanium chloride (IV), germanium iodide (IV), tin bromide (IV), tin chloride (IV), tin fluoride (IV), tin iodide (IV), lead fluoride (IV), antimony bromide (III), antimony chloride (III), antimony chloride (V), antimony fluoride (III), antimony fluoride (V), antimony iodide (III), bismuth bromide (III), bismuth chloride (III), bismuth fluoride (III), bismuth iodide (III), titanium chloride (IV), titanium bromide (IV), $BF_3 \cdot OEt_2$, tungsten chloride (VI), vanadium chloride (V), iron chloride (III), and zinc bromide (II); and organic metal halides such as $Et_2AlCl$ and $EtAlCl_2$. The catalyst is not specifically limited to any of those described above and any of those may be used alone or in combination of two or more. Of the above catalysts, boron bromide (III), boron chloride (III), tin chloride (IV), tin bromide (IV), tin chloride (IV), tin fluoride (IV), tin iodide (IV), and antimony chloride (V) are preferable in terms of control of a branched structure and polymerization activity. Boron chloride (III) and tin chloride (IV) are more preferable. Tin chloride (IV) is particularly preferable.

Initiators represented by the general formula (1) include compounds such as (1-chlor-1-methylethyl)benzene, 1,4-bis (1-chlor-1-methylethyl)benzene, 1,3-bis(1-chlor-1-methylethyl)benzene, 1,3,5-tris(1-chlor-1-methylethyl)benzene, 1,3-bis(1-chlor-1-methylethyl)-5-(tert-butyl)benzene, 1-chloroethylbenzene, and 1-bromoethylbenzene. Preferable are bis(1-chlor-1-methylethyl)benzene, 1-chloroethylbezene, and 1-bromoethylbenzene.

The polymerization for producing the soluble aromatic copolymer (A) is performed at a temperature of 20 to 100° C. When the polymerization reaction is carried out at a temperature of less than 20° C., it is unfavorable because of a decrease in thermostability of the generated copolymer. In contrast, more than 100° C. is unfavorable because it leads to an excessive reaction rate, the reaction can be hardly controlled, and the generation of insoluble gel due to cross-linkage tends to occur. A method of collecting a copolymer after terminating the polymerization reaction is not specifically limited. The method may be, for example, a steam-stripping method or a method of precipitation in a poor solvent, which is commonly used in the art.

The soluble aromatic polymer (A) preferably includes a structural unit derived from a monovinyl aromatic compound represented by the following general formula (a2):

(a2)

(where $R^4$ represents an aromatic hydrocarbon group having 6 to 30 carbon atoms), and an existing mole ratio (a1)/((a1)+(a2)) of the structural unit represented by the general formula (a1) and the structural unit represented by the general formula (a2) is 0.1 or more, preferably 0.3 or more, particularly preferably 0.5 or more. If it is less than 0.1, a hologram recorded will disappear with time.

Further, the soluble aromatic polymer (A) preferably contains, in its main-chain skeleton structure, 0 to 20 mol % of an indan structural unit represented by the following general formula (2):

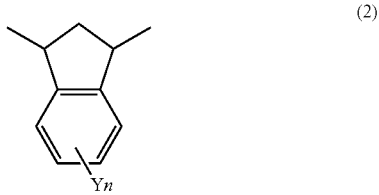

(2)

(where Y represents a saturated or unsaturated aliphatic hydrocarbon group or aromatic hydrocarbon group, or an aromatic ring condensed to a benzene ring, or a substituted aromatic ring and n represents an integer of 0 to 4). When the copolymer (A) is produced by the above manufacturing method, the indan structure is produced under the conditions in which a specific solvent, catalyst, temperature, and so on are employed. The active point at the terminal of the growing polymer chain is generated by attacking an aromatic ring of the structural unit derived from each of the divinyl aromatic compound and the monovinyl aromatic compound. The indan structure preferably exists in an amount of 0.01 mol % or more, more preferably 0.1 mol % or more, further preferably 1 mol % or more, particularly preferably 3 mol % or more, and most preferably 5 mol % or more with respect to the structural unit of all the monomers. The absence of the above indan structure in the main chain skeleton of the polyfunctional vinyl aromatic copolymer of the present invention is unfavorable because of insufficient thermostability and insufficient solubility to a solvent.

The number average molecular weight of the soluble aromatic copolymer (A) (based on standard polystyrene conversion obtained by using gel permeation chromatography, hereinafter referred to as Mn) is preferably 400 to 30,000, more preferably 400 to 10,000, further preferably 500 to 5,000. Mn of less than 400 is unfavorable because the copolymer (A) shows an extremely low viscosity and poor workability. In addition, Mn of 30,000 or more is unfavorable because ready mass transfer is inhibited when a hologram is recorded.

Further, the molecular distribution (Mw/Mn) value of the soluble aromatic copolymer (A) is preferably 10 or less. The Mw/Mn of over 10 is unfavorable because it causes problems such as poor workability of the soluble polyfunctional vinyl aromatic copolymer and the generation of gel.

The soluble aromatic copolymer (A) has polymerizability because it has a structural unit represented by the general formula (a1) with an unsaturated bond. Further, it can be dissolved in toluene, xylene, tetrahydrofuran, dichloroethane, or chloroform, so it is possible to move the soluble aromatic copolymer (A) so as to cancel a concentration gradient when a specific part is polymerized as a composition.

Next, the photoradical polymerizable compound (B) will be described.

The photoradical polymerizable compound (B) to be used in the present invention preferably has good compatibility to the soluble aromatic copolymer (A) and the polymer binder (D) or the plasticizer (E) which will be described later, and is preferably one that polymerizes with an active radical species generated from a radical polymerization initiator. Advantageously, a monomer having at least one polymerizable functional group such as a (meth)acryloyl group, a vinyl group, or an allyl group in a molecule can preferably be used. The photoradical polymerizable compound (B) may use two or more photoradical polymerizable compounds with different polymerizability and refractive index.

When light is irradiated, the components which polymerize first (in the bright portion of interference light) are mainly the photoradical polymerizable compound (B) and the soluble aromatic copolymer (A). A cured material generated at this time is assumed to include a polymer of the soluble aromatic copolymer (A) and a copolymer of the photoradical polymerizable compound (B) and the soluble aromatic copolymer (A) as principal components. However, although recording is possible for an instant by the system in which the soluble aromatic copolymer (A) does not exist or the system in which an aromatic oligomer having no a reactive vinyl group is used instead of the soluble aromatic copolymer (A), the record is gradually eliminated when it is left standing for a while. Thus, it is believed that the soluble aromatic copolymer (A) serves to immobilize the record by its reaction with the photoradical polymerizable compound (B). Therefore, a refractive index difference may occur between the following components. 1) When using the polymer binder (D), the plasticizer (E), or both, in the bright portion, the cured materials of the soluble aromatic copolymer (A) and the photoradical polymerizable compound (B) are condensed (cured material concentration phase), while, in the dark portion, the polymer binder (D), the plasticizer (E), or both are condensed (non-cured material concentration phase), to thereby cause a refractive index difference. 2) When two or more kinds of the photoradical polymerizable compounds (B) are used and the photoradical polymerizable compound (B-2), which is inferior in reactivity than that reacted in the bright portion, is used, the polymer of the photoradical polymerizable compound (B-2) and the polymer binder (D), the plasticizer (E), or both are condensed in the dark portion (dark cured material and non-cured material concentration phase) to thereby cause a refractive index difference. Therefore, in the case of 1), the cured material concentration phase and the non-cured material concentration phase are required to have refractive indexes different from each other by a certain value or more. In the case of 2), the cured material concentration phase and the dark cured material and non-cured material concentration phase are required to have refractive indexes different from each other by a certain value or more. The refractive index is adjusted by selecting the types and the amounts of the photoradical polymerizable compound (B), the polymer binder (D), and the plasticizer (E).

Examples of the photoradical polymerizable compound (B) include: monofunctional (meth)acrylates such as methyl (meth)acrylate, butyl (meth)acrylate, 2-ethylhexyl (meth) acrylate, lauryl (meth)acrylate, ethyl carbitol (meth)acrylate, phenoxyethyl (meth)acrylate, nonyl phenoxy ethyl (meth) acrylate, dicyclopentenyl (meth)acrylate, isobornyl (meth) acrylate, tribromo benzyl (meth)acrylate, and acryloyl morpholine; silicon-containing (meth)acrylate such as (meth) acryloxypropyl tris(methoxy)silane; di(meth)acrylates of bisphenol compound added with alkylene oxide, such as bisphenol F, bispenol A, and hydrogenated bispenol A; polyfunctional (meth)acrylates such as trimethylolpropane tri (meth)acrylate, dipentaerythritol pentaacrylate, pentaerythritol triacrylate, pentaerythritol tetra acrylate, ditrimethylol tetraacrylate, and dipentaerythritol hexaacrylate; epoxy (meth)acrylates as reaction products of various kinds of known epoxy compounds and (meth)acrylates, such as ethyleneglycol diglycidyl ether-epoxy (meth)acrylate, propylene glycol diglycidyl ether-epoxy di(meth)acrylate, phenol glycidyl ether-epoxy (meth)acrylate, resorcin diglycidyl ether-epoxy (meth)acrylate, bisphenol-A diglycidyl ether-epoxy di(meth)acrylate, bis(4-hydroxyphenyl)sulfide diglycidyl ether-epoxy (meth)acrylate, phenol novolak type epoxy resin-(meth)acrylate, cresol novolak type epoxy resin-(meth) acrylate, bisphenol (e. g., bisphenol A and bisphenol F) type epoxy resin-(meth)acrylate, bisphenol (e. g., 3,3',5,5'-tetramethyl biphenol) type epoxy resin-(meth)acrylate, and tris (2,3-epoxypropyl) isocyanurate-(meth)acrylate; acrylic amides such as N,N-dimethylacrylamide and N,N-diethyl acrylamide; monofunctional vinyl compounds such as vinyl benzene, divinyl benzene, vinyl naphthalene, vinyl biphenyl, acenaphthylene, styrene, p-chlorostyrene, N-vinyl carbazole, N-vinyl pyrolidone, and N-vinyl caprolactam; allyl group-containing compounds such as di-allylidene pentaerythtol, diallylphthalate, diallyl isophthalate, ethyleneglycol diallyl carbonate, trimellitic acid triallyl ester, and triallyl (iso)cyanurate; or various kinds of known polymerizable monomers or oligomers thereof such as urethane (meth)acrylates; polyurethane (meth)acrylates; thiourethane acrylates; polythiourethane acrylates; ester acrylates; polyester (meth)acrylates; polyether (meth)acrylates; sulfur-containing (meth)acrylates; and sulfur-containing polyfunctional (meth)acrylates; various kinds of polymerizable monomers or oligomers thereof; and various kinds of photopolymerizable oligomers.

Of those, the (meth)acrylate-based monomer having comparatively good photopolymerizability is preferable. In particular, a combination of (meth)acrylates including (meth) acrylates having two or more functional groups leads to good hologram-recording property.

The photoradical polymerizable compound (B) can be polymerized and cured by light irradiation after incorporating into a composition, while a part thereof may be copolymerized with the soluble aromatic copolymer (A) and cured.

Next, the photopolymerization initiator system (C) will be described.

The photopolymerization initiator system (C) may be an initiator that absorbs a visible-light laser beam such as a He-Ne laser (633 nm), Ar laser (515, 488 nm), YAG laser (532 nm), He-Cd laser (442nm), or blue DPSS laser (405 nm) beam to produce a radical and allows the resulting active radical species to polymerize the soluble aromatic copolymer (A) and the photoradical polymerizable compound (B), which are essential components of the present invention. In addition, for raising the sensitivity at each laser light wavelength, a pigment-sensitizer may be added.

Examples of photo polymerization initiator include 2,2-diethoxyacetophenone, 2,2-diethoxy-2-phenylacetophenone, benzophenone, 1-(4-isopropylphenyl)-2-hydroxy-2-methylpropane-1-one, 2-hydroxy-2-methyl-1-phenylpropan-1-one, benzoin ethyl ether, benzoin isobutyl ether, benzoin isopropyl ether, 1-hydroxy-cyclohexyl-phenyl-ketone, 2,2-dimethoxy-1,2-diphenylethane-1-one, 1-hydroxy-cyclohexyl-phenyl-ketone, 2-hydroxy-2-methyl-1-phenyl-propan-1-one, 1-(4-hydroxyethoxy)-phenyl-2-hydroxy-2-methyl-1-propan-1-one, 2-methyl-1-(4-(methylthio)phenyl)-2-morpholinopropan-1-one, 2-benzyl-2-dimethylamino-1-(4-morpholinophenyl)-butanone-1, bis (2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, bis(η 5-2,4-cyclopentadien-1-yl)-bis(2,6-difluoro-3-(1H-pyrrol-1-yl)phenyl)titanium, 4,4-bisdimethylaminobenzophenone, methylbenzoisoformate, benzyldimethyl ketal, benzoylbenzoic acid, 4-dimethylaminoethyl benzoate, 2-chlorothioxanthone, 2-methylthioxanthone, 2,4-diethylthioxanthone, 2,4-dimethylthioxanthone, camphorquinone, benzyl, and 4,4' -diethylaminobenzophenone. Examples of commercially available photopolymerization initiators include Irgacure 184, 369, 500, 651, 819, 907, 784, 2959, Darocurl 116,1173 (all manufactured by Ciba Specialty Chemicals Co.).

In addition, a thermopolymerization initiator can be used together with the above-mentioned photopolymerization initiators. Examples of the thermalpolymerization initiators used together include 2,2' -azobis(2-methylbutyronitrile), 2,2' -azobisisobutyronitrile, 2,2' -azobisisovaleronitrile, 2,2' -azobis(2,4-dimethylvaleronitrile), 1,1' -azobis(cyclohexane-1-carbonitrile), methylethylketone peroxide, methylisobutylketone peroxide, benzoyl peroxide, and 2,4-dichlorobenzoyl peroxide.

The additive amounts of the initiators cannot be determined categorically because the additive amounts vary depending on the kinds of the respective initiators, the kinds of compounds to be mixed with, and the composition ratios. However, the additive amount of the initiator with respect to the whole amount of a photosensitive resin composition is preferably in the range of 0.05 to 30% by weight, particularly preferably in the range of 0.1 to 8% by weight. If the additive amount of the initiator is less than 0.05% by weight, the resulting composition has poor curable property and poor recording stability, while leaving an unreacted product. In addition, if the additive amount of the initiator exceeds 30% by weight, the resulting composition has a small polymerization degree and a cured product softens excessively. In some cases, the transparency decreases. Thus, it is unfavorable. In the case of the additive amount of the initiator being 0.1 to 8% by weight, a photosensitive resin composition having particularly excellent curable property and excellent hologram characteristics can be provided.

When the pigment-sensitizer is used, the pigment-sensitizer may be any of those capable of absorbing visible light, including known compounds such as a (thio)xanthene pigment, a cyanine pigment, a melocyanine pigment, a squarium pigment, a thiopyrylium salt pigment, a quinoline pigment, a (base)styryl pigment, a (keto)coumarin pigment, a rhodacyanine pigment, a porphyrin pigment, and an oxazine pigment. These compounds may be used independently or in combination of two or more.

In the present invention, for example, the polymer binder (D) can be used for improving film-forming property and film strength, which can support a thick film, or increasing resistance to environment after recording a hologram. The polymer binder (D), which can be used for such a purpose, is preferably one having high transparency and high compatibility with the soluble aromatic copolymer (A). Examples of the polymer binder (D) include: polystyrene and a derivative thereof, a methyl methacrylate-styrene copolymer (MS resin), a styrene-acrylonitrile copolymer (AS, SAN resin), poly(4-methyl pentene-1)(TPX resin), polycycloolefin (COP resin), polydiethylene glycol bisallyl carbonate (EGAC resin), polythiourethane (PTU resin), poly methyl vinyl ether (PMVE resin), a polysulfone resin, polyvinyl acetate, polyvinyl alcohol, polyvinylpyrrolidone, and acetyl cellulose. The polymer binder (D) may have a reactive group such as a cationic polymerizable group on the side chain or main chain thereof. One or more of these compounds may be added.

In the present invention, compounds, which can be employed for the mass transfer of the soluble aromatic copolymer (A) and the photoradical polymerizable compound (B) or for an improvement in compatibility of the photosensitive resin composition, the plasticizer (E) can be used. The plasticizer (E) can be suitably selected from those in a liquid form that allows the mass transfer at the time of recording as well as having compatibility to the aromatic copolymer (A) and the photoradical polymerizable compound (B). Examples of the plasticizer (E) are those known in the art, including: sebacate such as dimethyl sebacate, diethyl sebacate, dibutyl sebacate, and bis(2-ethylhexyl)sebacate; adipate such as dimethyl adipate, diethyl adipate, dibutyl adipate, and bis(2-ethylhexyl)adipate; phthalate such as dimethyl phthalate, diethyl phthalate, dibutyl phthalate, bis(2-ethylhexyl)phthalate, and diisodecyl phthalate; orthophosphate such as trimethylphosphate, triethylphosphate, tributylphosphate, (2-ethylhexyl)phosphate, triphenylphosphate, cresyldiphenylphosphate, and tricresylphosphate. These compounds can be used independently or in combination.

Further, if required, a known additive (F) such as a thermal polymerization inhibitor, a chain transfer agent, an oxidation inhibitor, a silane coupling agent, a painted surface conditioner, a face conditioner, a plasticizer, an anti-foamant, a surfactant, a coloring agent, a conservation stabilizer, a UV absorber, and a thickener may be added.

When the resin composition of the present invention is in solid form or having high viscosity and therefore having difficulty in coating, a solvent (G) may be used for dissolving or dispersing the resin composition. Examples of the solvent (G) include: ketones such as acetone, methyl ethyl ketone, methyl isobutyl ketone, and cyclohexanone; esters such as ethyl acetate and butyl acetate; petroleum solvents such as toluene and xylene; cellosolves such as methyl cellosolve, ethyl cellosolve, and butyl cellosolve; alcohols such as ethanol, methanol, isopropanol, and butanol; ethers such as tetrahydrofuran and dioxan; and halogenated hydrocarbons such as dichloromethane and chloroform. The solvent may be mixed in amount of preferably 200 parts by weight or less, more preferably 100 parts by weight or less per 100 parts by weight of a resin solid component. In addition, for enhancing the efficiency of the subsequent drying process, the solvent may have a boiling point of preferably 100° C. or less. Note that, the solvent (G) is a component for dissolving or dispersing the resin composition. Thus, it is not a constitutional component of the resin composition of the present invention, so that it is excluded from a calculation of the content of each component.

Further, the components to be used as essential components in the composition of the present invention may be (A) to (C) and (D) or (E). Preferably, both (D) and (E) may be used. In addition, the descriptions about the above components, other components (F) and the like, and the solvent (G) are not limited to those illustrated herein.

(Composition of Hologram-Recording Material)

In the photosensitive resin composition for volume phase hologram recording of the present invention, with respect to the whole weight of the composition (excluding the solvent), the respective components are preferably mixed in the following ratio:

5 to 60% by weight, preferably 10 to 40% by weight of the soluble aromatic copolymer (A);

5 to 50% by weight, preferably 10 to 40% by weight of the photoradical polymerizable compound (B);

0.05 to 30% by weight, preferably 1 to 10% by weight of the photopolymerization initiator(C) (when a pigment-sensitizer is combined, 0.01 to 10% by weight thereof is added but the total amount of the pigment-sensitizer and the photopolymerization initiator does not exceed 30% by weight);

0 to 50% by weight, preferably 10 to 40% by weight of the polymer binder (D);

0 to 40% by weight, preferably 10 to 35% by weight of the plasticizer (E); and 20 to 80% by weight, preferably 30 to 70% by weight of the sum of the polymer binder (D) and the plasticizer (E).

(Preparation of Hologram-Recording Medium)

For preparing a hologram-recording medium from the photosensitive resin composition of the present invention, a suitable method is one in which a liquified photosensitive resin composition is applied on a substrate such as a glass plate, a polycarbonate plate, a polymethyl methacrylate board, or a polyester film, using a known coating device such as a spin coater, a roll coater, or a bar coater to form a film having a dry thickness of 1 to 1000 μm, and subjected to a drying step as needed, thereby forming a hologram-recording medium. In this case, a protective layer may be formed as an oxygen cutoff film on the photosensitive resin composition layer. The protective layer may be, for example, one equal to the above substrate or a film made of polyolefin, polyvinyl chloride, polyvinylidene chloride, polyvinyl alcohol, polyethylene terephthalate, or the like, or glass. In addition, when a sensitizing solution is applied, it may be diluted with a suitable solvent as needed. In this case, however, desiccation is needed after having applied the sensitizing solution on the substrate.

(Optical Source for Holograph Recording and Recording Method)

The recording layer prepared as described above can form a volume phase hologram by subjecting the recording layer to interference exposure by a method conventionally known in the art. For example, a common holography exposure equipment using a laser beam or light (for example, light at a wavelength of 300 to 1200 nm) excellent in coherence (potential interference) records an interference pattern in the inside thereof by two-beam interference pattern exposure. At this stage, diffracted light is obtained by the recorded interference pattern, thereby providing as a hologram. An optical source suitable for the hologram recording material of the present invention may be a He-Ne laser (633 nm), Ar laser (515, 488 nm), YAG laser (532 nm), He-Cd laser (442nm), a blue DPSS laser (405 nm) beam, or the like. In addition, after the hologram recording with the above laser or the like, the photorecording composition film is subjected to the whole-surface irradiation of ultraviolet (UV) with a xenon lamp, a mercury lamp, a metal halide lamp, or the like, or subjected to heat at about 60° C. to accelerate the polymerization of a part of the radical polymerizable compound, which is remained as being unreacted and a phase separation with the mass transfer. Consequently, a hologram having excellent hologram characteristics can be obtained.

BEST MODE FOR CARRYING OUT THE PRESENT INVENTION

Hereinafter, the present invention will be described specifically with reference to examples. However, the present invention is not limited to these examples. Symbols used in the examples are as follows:
DVB: divinyl benzene
DVB570: mixed monomer in which the ratio of component of DVB to ethylvinyl benzene is 57:43 (manufactured by Nippon Steel Chemical Co., Ltd). S2EG: bis(2-methacryloylthioethyl)sulfide (manufactured by SUMITOMO SEIKA CHEMICALS CO., LTD.)
TCP: tricresyl phosphate (manufactured by New Japan Chemical Co. Ltd)
MS-200: methylmethacrylate-stylene(20:80)copolymer.
MS-600: methylmethacrylate-stylene(60:40)copolymer.

Further, holograms and photosensitive resin compositions of the examples were evaluated by the following methods, respectively:
Evaluation of Hologram
Evaluation of Diffraction Efficiency
The diffraction efficiency of a transmission-type hologram is calculated by the following equation using a value read out by an optical power meter from diffracted light by a linear-polarized type He-Ne laser (632.8 nm):

Diffraction efficiency (%)=(diffracted-light intensity/ incident light intensity)×100

Evaluation of Environment Resistance
Variations of diffraction efficiency and transparency after one month from the recording (stored at 60° C.) (O: unchanged, Δ: slightly changed, X: changed)
Volume Shrinkage of Photosensitive Resin Composition
The cure shrinkage of the photosensitive resin composition can be calculated from the following equation by determining the densities of the resin composition before and after the curing. Here, the optical source used was a spot UV irradiation device. The UV at 6 mW/cm² was irradiated on a sample of 50 µm in thickness in the air.

Cure shrinkage (%)=(1−liquid density/film density)× 100

SYNTHETIC EXAMPLE 1

First, 2282 ml of a toluene solution (1806 ml of toluene, monomer concentration: 1.31 mol/ml, dielectric constant: 2.38) containing divinylbenzene 1.75 mol (258.9 ml), ethylvinylbenzene 1.30 mol (186.3 ml), and 1-chloroethyl benzene (289.1 mmol) was added to a 3000-ml flask and then heated to 30° C. Subsequently, 21.7 ml of 12.64 mmol SnCl₄ in toluene solution (concentration: 0.584 mmol/ml) was added and reacted for 4 hours. The polymerization was terminated with a small amount of methanol bubbled with nitrogen, followed by pouring the reaction mixture into a large amount of methanol at room temperature, thereby precipitating a soluble aromatic copolymer. The obtained copolymer was washed with methanol, filtrated, dried, and weighed, thereby obtaining 171.62 g of a soluble aromatic copolymer (yield: 42.9 wt %). The polymerization activity thereof was 3.39 (g polymer/mmol Sn·hr). The obtained copolymer had Mw of 6,930, Mn of 1,990, and Mw/Mn of 3.48.

SYNTHETIC EXAMPLE 2

First, 5.5 ml of dichloroethane solution (concentration: 0.73 mmol/ml) containing divinylbenzene 1.51 mol (223.4 ml), ethylvinylbenzene 0.71 mol (123.2 ml), and 1-chloroethyl benzene (364.2 mmol), and 3500 ml of dichloroethane (dielectric constant: 10.3) were added to a 5000-ml flask. Subsequently, 63.3 ml of 50.11 mmol SnCl₄ in dichloroethane solution (concentration: 0.074 mmol/ml) was added at 70° C. and reacted for 3 hours. The polymerization was terminated with a small amount of methanol bubbled with nitrogen, followed by pouring the reaction mixture into a large amount of methanol at room temperature, thereby precipitating a soluble aromatic copolymer. The obtained copolymer was washed with methanol, filtrated, dried, and weighed, thereby obtaining 178.91 g of a soluble aromatic copolymer (yield: 61.3 wt %). The polymerization activity thereof was 8.54 (g polymer/mmol Sn·hr). The obtained copolymer had Mw of 49,700, Mn of 9,730, and Mw/Mn of 5.1.

EXAMPLE 1

A solution of a photosensitive resin composition for volume phase hologram recording was prepared by mixing the following components.
To 50 g of dichloromethane, 10 g of the copolymer obtained from Synthetic Example 1, 15 g of TCP, 20 g of MS-200, 15 g of S2EG, 0.1 g of 1-hydroxycyclohexyl phenylketone (Irgacure 184, manufactured by Ciba Specialty Chemicals Co.), and 0.01 g of 3-ethyl-5-[(3-ethyl-2(3H)-benzothiazolylidene)ethylidene]-2-thioxo-4-oxazolidinone (NK-1473, manufactured by Hayashibara Biochemical Laboratories, Inc.), thereby obtaining a photosensitive solution.
The resulting solution was applied on the one side of a glass substrate (50 mm×50 mm) of 0.5 mm in thickness by a bar coater to make a film with a dry thickness of 50 µm and then dried for 1 hour in an inert oven being set at 50° C. under nitrogen atmosphere, thereby preparing a photographic plate for recording a volume phase hologram. As a protective film, a 38-µm PET film was laminated on the photographic plate, thereby providing an optical information recording medium.
On the obtained recording medium, an interference pattern with a space frequency of about 1,000 strips/mm was prepared using a procedure of two-beam interference exposure with 514.5-nm light of argon ion laser and then irradiated from the PET side, thereby recording a volume phase hologram. The exposure of a transmittance-type hologram was carried out such that light with an optical intensity on the photographic plate of 1 mW/cm² was irradiated for 10 to 100 seconds at a light exposure of 10 to 100 mJ/cm². The obtained volume phase hologram had a diffraction efficiency of 82% at a light exposure of 13 mJ/cm². In addition, the resin composition had a cure shrinkage of 0.5%.

EXAMPLES 2 TO 6 AND COMPARATIVE EXAMPLES 1 TO 3

Solutions of photosensitive resin compositions were prepared in the same manner as that of Example 1, except for the mixture compositions shown in Table 1. Optical information recording media were obtained from these solutions, respectively, followed by recording and evaluating holograms thereon. The compositions and evaluation results were listed in Table 1, respectively. In Table 1, a DVB oligomer (Mn=2,000) represents the copolymer obtained in Synthetic Example 1 and a DVB oligomer (Mn=10,000) represents a copolymer obtained in Synthetic Example 2.

mer (A) which: is soluble in toluene, xylene, tetrahydrofuran, dichloroethane or chloroform; has a structural unit of a divinyl aromatic compound and a structural unit of a monovinyl aromatic compound; and contains 10 mol % or more of a structural unit represented by the following general formula (a1):

(a1)

TABLE 1

|  | Component Name | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| Composition | (A) soluble polyfunctional vinyl aromatic copolymer (g) | | | | | | | | | |
|  | DVB oligomer (Mn = 2000) | 10 | | 10 | 10 | 10 | 10 | | 10 | |
|  | DVB oligomer (Mn = 1000) | | 10 | | | | | | | |
|  | (B) Radical polymerizable monomer (g) | | | | | | | | | |
|  | bis(2-methacryloylthioethyl)sulfide | 15 | 15 | 15 | | | 15 | 15 | | 15 |
|  | Acryloyl morpholine | | | | 15 | | | | | |
|  | Phenoxyethyl acrylate | | | | | 15 | | | | |
|  | Ethylene glycol dimethacrylate | | | | 5 | 5 | | | | |
|  | DVB570 | | | | | | | | | 10 |
|  | (C) Photopolymerization initiator (g) | | | | | | | | | |
|  | irgacure-184 | 0.1 | 0.1 | 0.1 | 0.1 | 0.1 | | 0.1 | 0.1 | 0.1 |
|  | irgacure-784 | | | | | | 0.5 | | | |
|  | (C) Sensitizer (g) | | | | | | | | | |
|  | NK-1473 | 0.01 | 0.01 | 0.01 | 0.01 | 0.01 | | 0.01 | 0.01 | 0.01 |
|  | (D) Polymer binder (g) | | | | | | | | | |
|  | MS-200 | 20 | 20 | | 20 | 20 | 20 | 20 | 20 | 20 |
|  | MS-600 | | | 20 | | | | | | |
|  | (E) Plasticizerr (g) | | | | | | | | | |
|  | Tricresyl phosphate | 15 | 15 | 15 | 15 | 15 | 15 | 15 | 15 | 15 |
|  | (G) Solvent (g) | | | | | | | | | |
| Physical property | Dichloromethane | 50 | 50 | 50 | 50 | 50 | 50 | 40 | 50 | 50 |
|  | Film thickness (um) | 48 | 52 | 52 | 46 | 47 | 49 | 42 | 50 | 50 |
|  | Light exposure(mJ/cm2) | 13 | 18 | 35 | 19 | 22 | 12 | 100 | 100 | 42 |
|  | Maximum diffraction rate (%) | 82 | 45 | 73 | 77 | 68 | 85 | Recording impossible | Recording impossible | 34 |
|  | Cure shrinkage (%) | 0.5 | 0.8 | 0.5 | 1.5 | 1.3 | 0.4 | — | — | 7.2 |
|  | Environment resistance: transmittance change | ○ | Δ | Δ | ○ | ○ | ○ | — | — | x |
|  | Environment resistance: diffraction efficiency change | ○ | Δ | ○ | Δ | Δ | ○ | — | — | x |

INDUSTRIAL APPLICABILITY

According to the present invention, a soluble polyfunctional vinyl aromatic copolymer can be used in a photosensitive resin composition to provide a material for volume phase hologram recording, a volume phase hologram recording medium, and a volume phase hologram, which are excellent in sensitivity, low cure shrinkage, and transparency as well as transparency.

The invention claimed is:

1. A photosensitive resin composition for volume phase hologram recording, comprising: a soluble aromatic copolywhere $R^1$ represents an aromatic hydrocarbon group having 6 to 30 carbon atoms;
a photoradical polymerizable compound (B) which is copolymerizable with the soluble aromatic copolymer (A);
a photopolymerization initiator (C); and
a polymer binder (D) or a polymer binder (D) and a plasticizer (E), wherein
the soluble aromatic copolymer (A) is incorporated in an amount of 5 to 60% by weight; and
the soluble aromatic copolymer (A) has a number average molecular weight of 400 to 10,000.

2. An optical information recording medium for volume phase hologram recording, comprising a recording layer made of the photosensitive resin composition according to claim 1 formed on a substrate or between two substrates.

3. A volume phase hologram, which is obtained by recording an interference pattern formed of energy lines excellent in coherence on the optical information recording medium according to claim 2.

4. A method of manufacturing a volume phase hologram, comprising the steps of exposing and recording an interference pattern formed of energy lines excellent in coherence on the recording medium according to claim 2.

5. A photosensitive resin composition for volume phase hologram recording according to claim 1, wherein composition includes both a polymer binder (D) and a plasticizer (E).

6. An optical information recording medium for volume phase hologram recording, comprising a recording layer made of the photosensitive resin composition according to claim 5 formed on a substrate or between two substrates.

7. A volume phase hologram, which is obtained by recording an interference pattern formed of energy lines excellent in coherence on the optical information recording medium according to claim 6.

8. A method of manufacturing a volume phase hologram, comprising the steps of exposing and recording an interference pattern formed of energy lines excellent in coherence on the recording medium according to claim 6.

9. A photosensitive resin composition for volume phase hologram recording according to claim 1, wherein the amounts of components are as follows:
   5 to 60% by weight of the soluble aromatic copolymer (A);
   5 to 50% by weight of the photoradical polymerizable compound (B);
   0.05 to 30% by weight of the photopolymerization initiator (C)
   10 to 40% by weight of the polymer binder (D);
   0 to 40% by weight of the plasticizer (E); and
   20 to 80% by weight of the sum of the polymer binder (D) and the plasticizer (E).

10. A photosensitive resin composition for volume phase hologram recording according to claim 1, wherein the amounts of components are as follows:
   10 to 40% by weight of the soluble aromatic copolymer (A);
   10 to 40% by weight of the photoradical polymerizable compound (B);
   1 to 10% by weight of the photopolymerization initiator (C);
   10 to 40% by weight of the polymer binder (D);
   10 to 35% by weight of the plasticizer (E); and
   30 to 70% by weight of the sum of the polymer binder (D) and the plasticizer (E).

* * * * *